United States Patent [19]

Arnold et al.

[11] Patent Number: 5,649,981
[45] Date of Patent: Jul. 22, 1997

[54] TOOL AND FIXTURE FOR THE REMOVAL OF TAB LEADS BONDED TO SEMICONDUCTOR DIE PADS

[75] Inventors: Richard W. Arnold, Midland; Lloyd W. Darnell, Denton, both of Tex.

[73] Assignee: Texas Instruments Incorporated, Dallas, Tex.

[21] Appl. No.: 706,768

[22] Filed: Sep. 23, 1996

Related U.S. Application Data

[63] Continuation of Ser. No. 375,462, Jan. 19, 1995, Pat. No. 5,591,649.

[51] Int. Cl.$^6$ ............................................. H01L 21/68
[52] U.S. Cl. ........................... 29/25.01; 29/705; 29/762
[58] Field of Search ...................... 73/827; 29/25.01, 29/762, 705; 437/8, 923

[56] References Cited

U.S. PATENT DOCUMENTS

| | | | |
|---|---|---|---|
| 3,581,557 | 6/1971 | Drees et al. | 73/827 |
| 4,000,842 | 1/1977 | Burns | 228/180 A |
| 4,420,880 | 12/1983 | Mielke | 29/764 |
| 4,842,662 | 6/1989 | Jacobi | 156/633 |
| 5,008,997 | 4/1991 | Phy | 29/827 |
| 5,046,657 | 9/1991 | Iyer et al. | 228/123 |
| 5,085,084 | 2/1992 | Salatino | 73/827 |
| 5,214,849 | 6/1993 | Jones, Jr. | 29/762 |
| 5,214,963 | 6/1993 | Widder | 73/827 |
| 5,334,809 | 8/1994 | DiFrancesco | 200/262 |
| 5,341,685 | 8/1994 | Malone | 73/827 |
| 5,342,807 | 8/1994 | Kinsman | 437/209 |
| 5,412,997 | 5/1995 | Hu et al. | 73/150 A |
| 5,424,254 | 6/1995 | Damiot | 437/243 |

FOREIGN PATENT DOCUMENTS

| 2186663 | 7/1990 | Japan | 29/25.01 |
|---|---|---|---|

OTHER PUBLICATIONS

*IBM Technical Disclosure Bulletin*; "Chip/Tape of Tape/Lead Frame Interface Delamination Technique"; vol. 32, No. 8A, Jan., 1990, p. 468.

*Primary Examiner*—David E. Graybill
*Attorney, Agent, or Firm*—Stanton C. Braden; W. James Brady, III; Richard L. Donaldson

[57] ABSTRACT

An apparatus for use in a removable tab procedure whereby tabs (7) are affixed to the pads (3) by initially having the bonding surface as flat as possible so that bonding pressures from pad to pad are relatively uniform. Bonding is preformed with the pressure applied to the pads being such that the tabs can later be easily removed without damage to the die pads, yet sufficiently strong so that the tabs do not come loose during burn in and testing. A bond strength pull between about 5 and about 40 grams per pad is appropriate for this purpose. The tabs are removed by placing the tested die (1) and attached tabs in a fixture (11) and providing a tool (31) dimensioned and moved along a path (13, 15, 17, 19) whereby each of the tabs is serially removed with the pressure applied to each tab to provide removal being preferably no greater than 40 grams. In this manner, since only one tab is removed at a time, there is no requirement that the extraction tool provide a great force to the die, thus minimizing the possibility of a greater than acceptable force being applied to any one tab for removal.

4 Claims, 3 Drawing Sheets

TOOL AND FIXTURE FOR THE REMOVAL OF TAB LEADS BONDED TO SEMICONDUCTOR DIE PADS

This is a continuation of application Ser. No. 08/375,462, filed Jan. 19, 1995, U.S. Pat. No. 5,591,649.

BACKGROUND OF THE INVENTION

1. Field of the Invention

This invention relates to a method of extracting a known good die (KGD) from a test carrier without damaging bond pads on the die and to a tool for extraction of the die from the test carrier.

2. Brief Description of the Prior Art

The electronics industry is presently developing technologies for multichip modules (MCMs). A multichip module is a hybrid composed of several very large scale integrated circuits. In order that the MCM become a successful manufacturing technology, there must be a readily available source of known good dice (KGD). KGD are dice that have been burned in and tested at temperatures that the customer specifies passed the required electrical testing necessary to demonstrate the quality and reliability of the dice. When MCMs are built with dice that have not been screened, the process yield drops off in proportion to the number of dice in the MCM. The larger the number of dice, the poorer the yield. If any of the dice are defective, the entire module will fail electrical test.

Dice have been tested in the prior art to identify KGD by, for example, applying tabs to the bond pads of the dice and then cutting the tabs after testing the dice, leaving a portion of the tab attached to each bond pad. This results in the remaining portion of the tab extending from the pad and being available for flip tab bonding. This method of manufacture of KGD is very costly and hard to perform.

Known good dice have also been tested by applying tabs to the die pads and then extracting all of the tab bonds together subsequent to testing. The application force applied to the tabs during extraction must be sufficient to remove all tabs simultaneously, this force being relatively high and generally sufficiently high (generally several hundreds of grams) to result in damage to the die pads and often leaving portions of the tabs secured to the die pads. This is because the total force exerted for tab removal is very large and it is therefore difficult to insure that each tab receives a sufficiently small force applied thereto to prevent damage to the die pads, yet a sufficiently large force to provide tab removal.

SUMMARY OF THE INVENTION

In accordance with the present invention, the above noted problems of the prior art are minimized and there are provided a procedure and tooling for testing for KGD without significant damage to the dice after testing is completed.

Briefly, there is provided a removable tab procedure whereby tabs are affixed to the pads by initially having the bonding surface as flat and even as possible so that bonding pressures from pad to pad are relatively uniform. This is accomplished with a statistically controlled arrangement that uses the bond strength to minimize the difference between the lowest and highest readings. Bonding is preformed, preferably using a gang bonder whereby all of the tabs are affixed concurrently, with the pressure applied to the pads being such that the tabs can later be easily removed without damage to the die pads, yet sufficiently strong so that the tabs do not come loose during burn in and testing. It has been found that the resulting bond strength between about 5 and about 40 grams is the correct parameter per pad appropriate for this purpose. The prior art uses the maximum possible force to provide such bonds and generally using a single point bonder. The tabs are removed by placing the tested die and attached tabs in a fixture and providing a tool dimensioned and moved along a path whereby each of the tabs is serially removed with the pressure applied to each tab to provide removal being no greater than 40 grams. In this manner, since only one tab per pad is removed at a time, there is no requirement that the extraction tool provide a great force to the die, thus minimizing the possibility of a greater than acceptable force being applied to any one tab for removal.

More specifically, the TAB package acts as the die carrier for testing. The dice receive electrical testing while in the TAB package and the dice are removed from the package with no damage to the bumps on the dice. The process has two phases. First, there is provided a bond attachment to the TAB leads that survives the testing conditions required by the electrical test. This process is different from normal TAB bonds where the objective is to maximize the bond strength. Instead, the process provides a minimal attachment that allows the TAB lead to be removed from the bump with the extraction tool. Second, the extraction tool removes the leads after electrical testing has been completed, one lead at a time, with no damage to the bump pad. The resulting die can then be categorized as KGD and used in an MCM without fear of yield loss due to usage of a defective die.

Initially, a bonder, preferably a gang bonder, is used to bond all of the tabs simultaneously to the bumps on the pads of the die. A single point tab bonder can also be used, however more time is required for completion of the bonding operation with this device. After testing, the bond is accurately placed on a tool having two pairs of orthogonal spaced apart grooves for receiving and guiding the path of the extraction tool. The die with tabs thereon is positioned in the rectangle formed by the grooves and a vacuum is pulled through the tool in the rectangular region to secure the die and tabs to the tool. An extraction tool in the shape of an inclined plane is moved along each of the grooves with the angle of the incline calculated to rise at a rate so that only one lead at a time receives an upward mechanical stress that removes the tab from the bump on the die. The incline is calculated to provide a force to the tab which is no more than the stress required to remove the tab from the bump by breaking the bond, this being less than 40 grams and generally in the range of 5 to 40 grams.

DESCRIPTION OF THE PREFERRED EMBODIMENT

Figure 1:
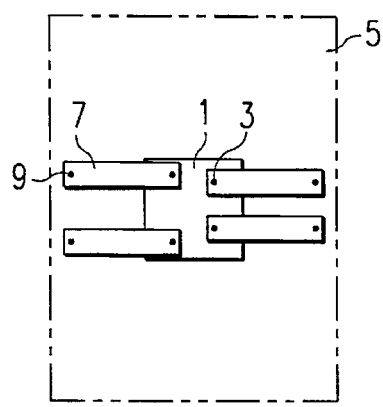
FIG. 1 is a schematic diagram of a die with tabs bonded thereto in accordance with the present invention.

Referring first to FIG. 1, there is shown a die 1 having pads 3 with bumps thereon of standard type. The die 1 is mounted on and secured to a backing or carrier of flexible electrical insulating material 5, preferably Kapton, and tabs 7 are bonded to the bumps 3 to provide leads for testing the die in standard manner. The bonds between the tabs 7 and bumps 3 are preferably made with a gang bonder, preferably a Shinkawa tab bonder, which makes all of the bonds between the tabs 7 and the bumps 3 simultaneously, though a single point bonder can be used. Care is taken to see that the force applied to each of the tabs 7 and associated pad 3 for bonding is between about 5 and 40 grams with statistical controls to provide weakened leads. While only four tabs 7 are shown in FIG. 1, it should be understood that the tabs 7 can extend from any one or more of the four sides of the die and that the number of tabs can be very large, such as about 400 or more. The tabs 7 are also bonded to test pads 9 disposed on the backing or carrier 5 which, in the TAB operation is generally performed by soldering or ultrasonic welding. The test package of die 1 and backing 5 with tabs 7 secured to the bond pads 3 is then placed in a carrier or test socket and tested in standard manner.

Figure 2:
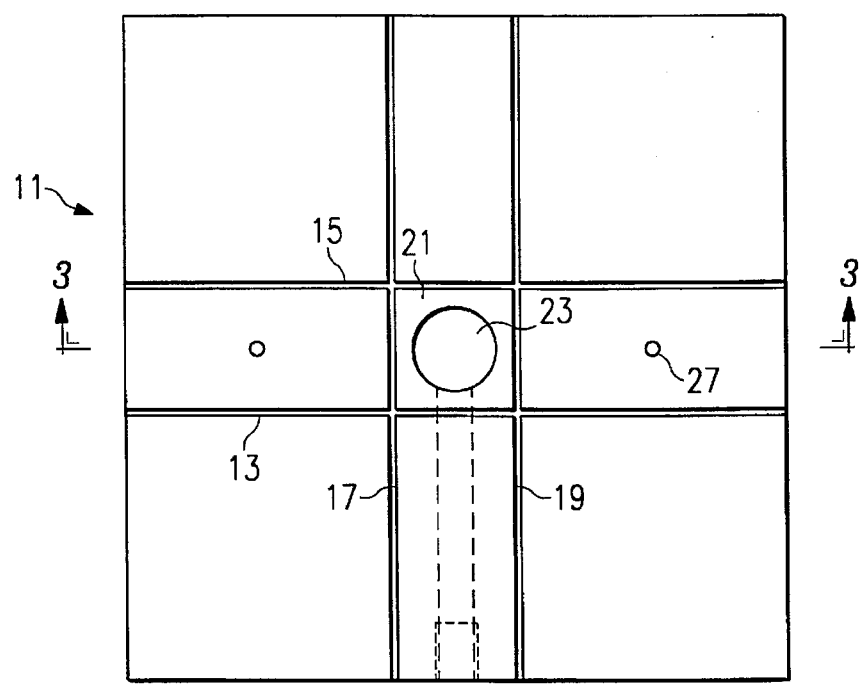
FIG. 2 is a top view of a fixture for use in removal of tabs from a die in accordance with the present invention.
Figure 3:
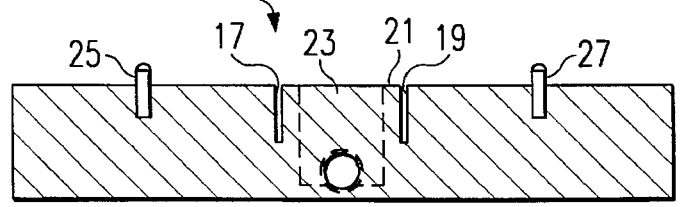
FIG. 3 is a cross sectional view of the fixture of FIG. 2 taken along the line 3—3 of FIG. 2.

After testing, it is necessary to remove the tabs 7 without damaging the pads 3 of the die 1. This is accomplished, one tab at a time, essentially in a zipper manner, so that a small force is applied to each bond for removal. Referring now to FIGS. 2 and 3, there is shown a fixture 11 for retaining the tested die for tab removal. The fixture 11 is a block of rigid material, preferably stainless steel, having a first pair of parallel spaced apart grooves 13 and 15 and a second pair of parallel spaced apart grooves 17 and 19 located normal to the first pair of grooves. The rectangle 21 formed by the pairs of grooves includes an aperture 23 therein in which a vacuum is created for retention of the die on the fixture 11. The rectangle 21 is preferably the same shape as the die 1 and of slightly larger dimension, preferably providing about a 3 to 4 millimeter space between the die edge and a groove 13, 15, 17 or 19. A pair of pins 25 and 27 are disposed in recesses in the fixture 11 for positioning of the die. There can be plural sets of apertures for pins 25 and 27 to accommodate different size dice. Also, such pins and apertures can be disposed on all four sides of the die rather than only two sides, as shown, to provide further assistance in accurate die positioning.

Figure 4:
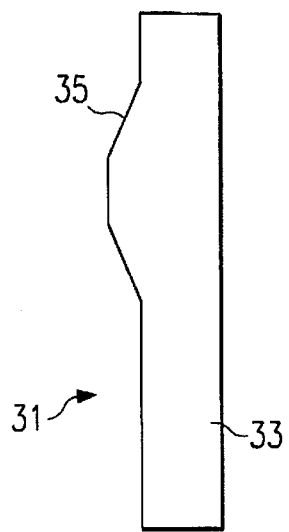
FIG. 4 is a side view of a tool for severing the bond between the tab and the bond pad in accordance with the present invention.

Referring now to FIG. 4, there is shown a tool 31 for severing of the bond between the tab 7 and the bump on the bond pad 3. The tool 31 is formed of rigid material, preferably stainless steel, and has a thickness substantially that of the grooves 13, 15, 17 and 19 but sufficiently less than that thickness so that it can be easily moved in the grooves. The tool 31 has a substantially rectangularly shaped body 33 except that there is an incline 35 at its forward end for application of a gradually increasing force applied to the tabs 7 during tab removal as will be explained hereinbelow. The angle of the incline 35 is adjusted to insure that maximum force is being applied to only one tab 7 at a time and that the tool is preferably contacting at most only one unsevered tab in addition to the tab being severed so that a high force is being applied to only one tab at a time. An angle of about 24 degrees has been found to provide the above described conditions though it should be understood that this angle can vary, depending upon the size of the die and the location of the tabs thereon.

Figure 5:
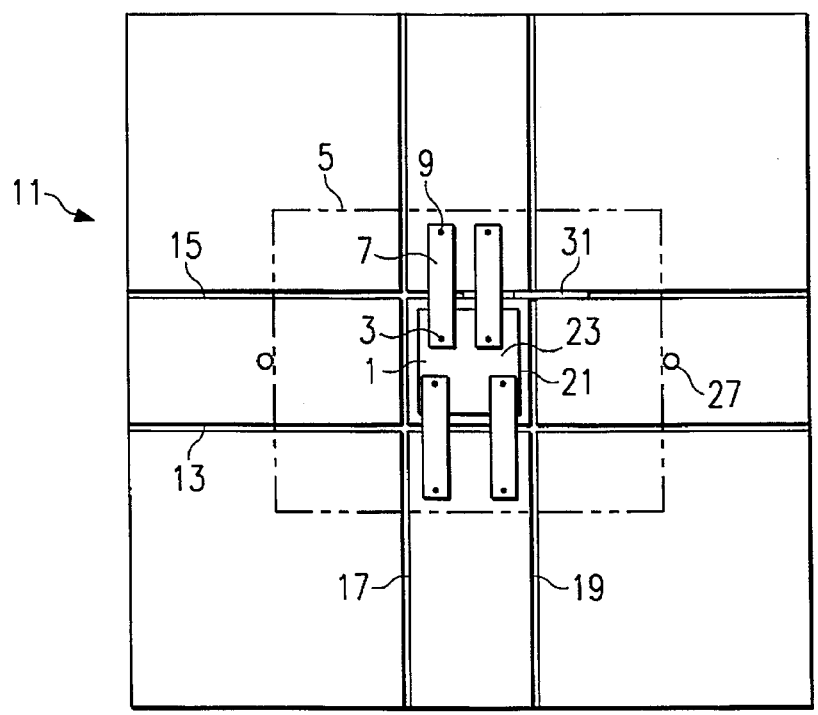
FIG. 5 is a diagram showing the operation of the tool of FIG. 4 in the fixture of FIGS. 2 and 3 to sever the bond between the tab and the bond pad in accordance with the present invention.
Figure 5A:
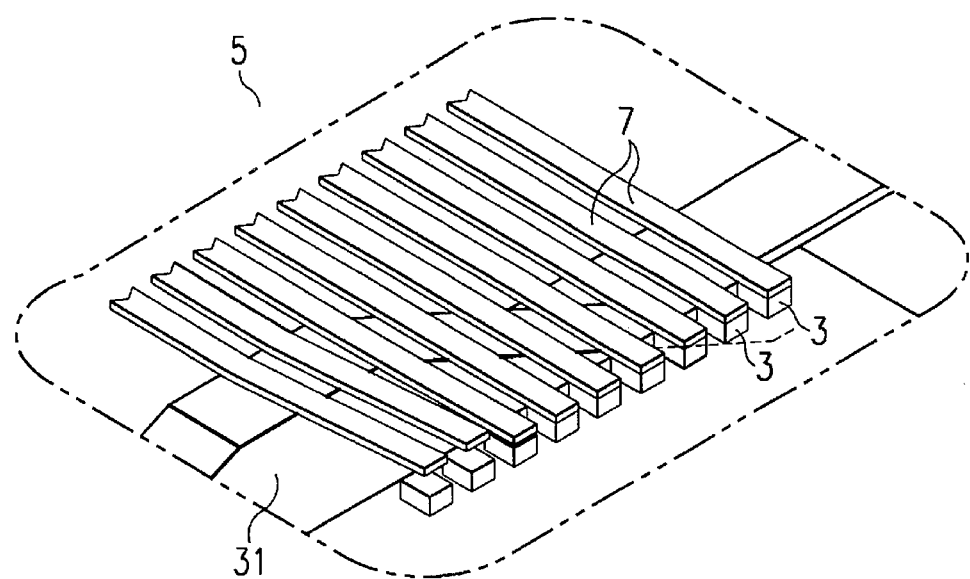
FIGS. 5a and 6 are enlarged views of a portion of FIG. 5.
Figure 6:
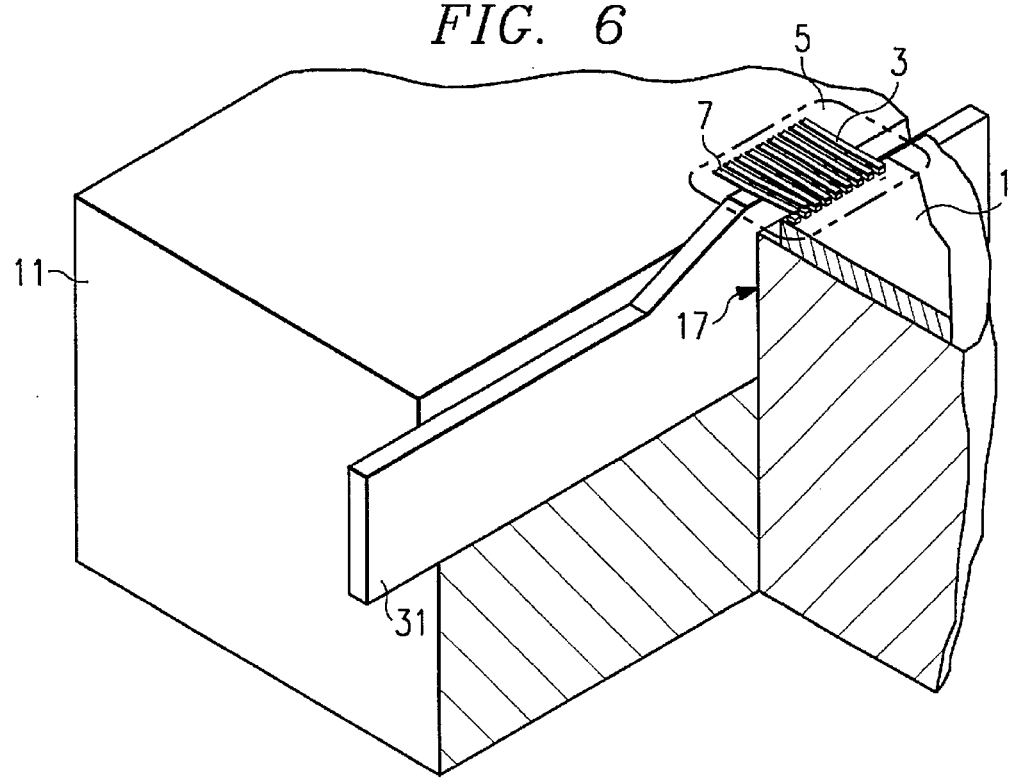

In operation, as shown in FIGS. 5 and 5a, the tabs 7 are bonded to the die pads 3, preferably using a gang bonder, with the bonds being of weakened type lower than normal bonding force. The tabs 7 are also bonded to test pads 9 (shown in FIG. 1) on the backing 5. The die 1 is now tested and burned in in standard manner. The elements shown in FIG. 1 are now placed on the fixture 11 of FIG. 2 so that the die 1 is disposed over the vacuum aperture 23 and in the region 21 with the pins 25 and 27 being used to accurately position the die and the backing 5. All of the pads 3 are positioned within the region 21, preferably closely adjacent a groove 13, 15, 17 or 19. The vacuum produced in the aperture 23 retains the die 1 in place during the tab severing operation. The tool 31 is then positioned in each of the grooves 13, 15, 17 and 19 with the inclined edge 35 in front and moved along the grooves. The resulting action is that the incline 35 reaches the first tab and applies a force only thereto which is sufficient to sever the bond between the tab 7 and the pad 3 but not sufficiently high to cause damage to the pad. The tool 31 continues down each groove and severs each tab-pad bond serially so that a large force is never required and is never present. In this manner, by moving the tool along each of the grooves 13, 15, 17 and 19, all of the tab-pad bonds are severed without damage to the pads.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modification.

We claim:

1. A tool for tab application and removal to a semiconductor die of tabs to associated die pads comprising:

(a) a fixture having a planar surface having thereon groove means and having means for removably securing said die to said surface adjacent said groove means;

(b) a tool having an inclined forward surface;

(c) means to secure said die to said fixture; and (d) means to move said tool along said groove means to apply a force to each said tab serially of sufficient force to serially sever said bond between said tab and said pads.

2. The tool of claim 1 wherein said inclined forward surface makes an angle of about 24 degrees with an adjacent surface.

3. The tool of claim 1 wherein said groove means includes a first pair of spaced apart parallel grooves, a second pair of spaced apart parallel grooves normal to said first pair of spaced apart parallel grooves and means in the region bounded by said grooves to removably secure said die to said surface.

4. The tool of claim 2 wherein said groove means includes a first pair of spaced apart parallel grooves, a second pair of spaced apart parallel grooves normal to said first pair of spaced apart parallel grooves and means in the region bounded by said grooves to removably secure said die to said surface.

* * * * *